United States Patent
Xi et al.

(10) Patent No.: US 8,079,278 B2
(45) Date of Patent: Dec. 20, 2011

(54) END EFFECTOR FOR NANO MANUFACTURING

(75) Inventors: Ning Xi, Okemos, MI (US); Uchechukwu Wejinya, Fayetteville, AR (US); Yantao Shen, Reno, NV (US)

(73) Assignee: Board of Trustees of Michigan State University, East Lansing, MI (US)

( * ) Notice: Subject to any disclaimer, the term of this patent is extended or adjusted under 35 U.S.C. 154(b) by 543 days.

(21) Appl. No.: 11/989,036

(22) PCT Filed: Jul. 21, 2006

(86) PCT No.: PCT/US2006/028540
§ 371 (c)(1),
(2), (4) Date: Apr. 23, 2009

(87) PCT Pub. No.: WO2007/014095
PCT Pub. Date: Feb. 1, 2007

(65) Prior Publication Data
US 2009/0217508 A1    Sep. 3, 2009

Related U.S. Application Data

(60) Provisional application No. 60/702,090, filed on Jul. 22, 2005.

(51) Int. Cl.
  *B01L 3/02* (2006.01)
  *G01N 1/02* (2006.01)
  *G01L 23/10* (2006.01)
(52) U.S. Cl. ....... 73/866.1; 422/501; 422/502; 977/872; 73/863.02; 73/704
(58) Field of Classification Search ............ 73/702, 73/863.02, 866.1; 422/501, 502, 504; 436/180; 977/872
See application file for complete search history.

(56) References Cited

U.S. PATENT DOCUMENTS

| | | | |
|---|---|---|---|
| 6,521,187 B1 | 2/2003 | Papen | |
| 6,575,020 B1* | 6/2003 | de Charmoy Grey et al. | 73/54.23 |
| 6,720,710 B1* | 4/2004 | Wenzel et al. | 310/328 |
| 7,389,679 B2* | 6/2008 | Battiston et al. | 73/61.79 |
| 2003/0143122 A1* | 7/2003 | Sander | 422/100 |
| 2004/0182707 A1* | 9/2004 | Jardemark et al. | 204/451 |
| 2004/0195851 A1 | 10/2004 | Hayashi | |
| 2008/0011058 A1* | 1/2008 | Lal et al. | 73/54.23 |
| 2008/0034840 A1* | 2/2008 | Mutharasan et al. | 73/24.01 |

OTHER PUBLICATIONS

A. Kuoni, R. Holzherr, M. Boillat, and N. F. de Rooji, "Polyimide Membrane with ZnO Piezoelectric Thin Film Pressure Transducers as a Differential Pressure Liquid Flow Sensor", Journal of Micromechanics and Microengineering 13 (2003) pp. S103-S107.*
D-H. Kim, Y. Sun, S. H. Lee, B. Kim, "Investigating chorion softening of sebrafish embryos with a microrobotic force sensing system." Journal of Biomechanics 38 (2005) pp. 1359-1363.*
Boillat, M. A. et al: "A Differential Pressure Liquid Flow Sensor for Flow Regulation and Dosing Systems," Proceedings of the Workshop on Micro Electrical Mechanical Systems. (MEMS). Amsterdam, Jan. 29-Feb. 2, 1995, New York, IEEE, US, vol. Workshop 8, Jan. 29, 1995, pp. 350-352, XP000555295, ISBN: 0-7803-2504-4.

* cited by examiner

*Primary Examiner* — Lisa Caputo
*Assistant Examiner* — Punam Roy
(74) *Attorney, Agent, or Firm* — Harness, Dickey & Pierce, P.L.C.

(57) ABSTRACT

An end-effector is provided for use on a micro/nano manipulation device. The end-effector is comprised of: a micropump fluidly coupled to a microtube; a piezoelectric sensing structure disposed in the microtube; and a processing circuit electrically coupled to the sensing structure for determining the force of the fluid flowing through the microtube. The end-effector is a closed loop control-enabled micro/nano manipulation system.

16 Claims, 18 Drawing Sheets

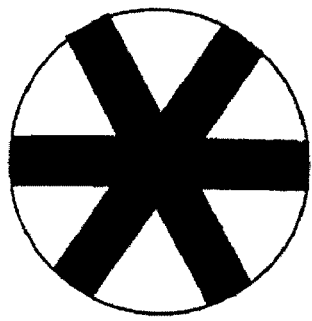 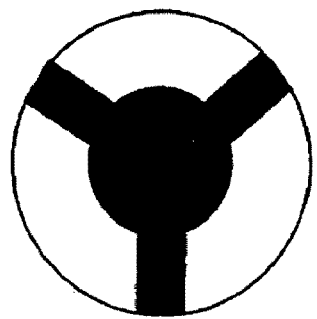 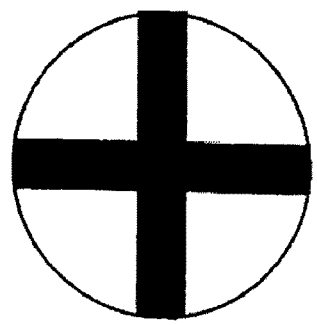
| FIG. a | FIG. b | FIG. c |
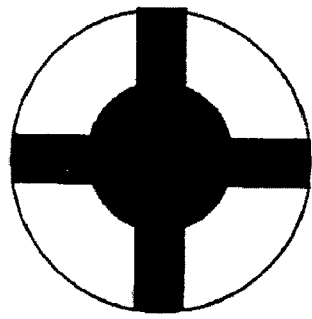 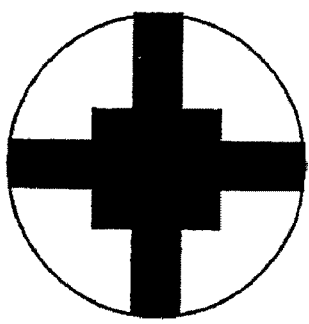 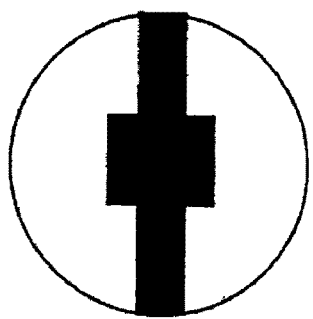
| FIG. d | FIG. e | FIG. f |
FIG. 7a-f (a) Water (b) Acetone (a) Water (b) Acetone (a) Water (b) Acetone

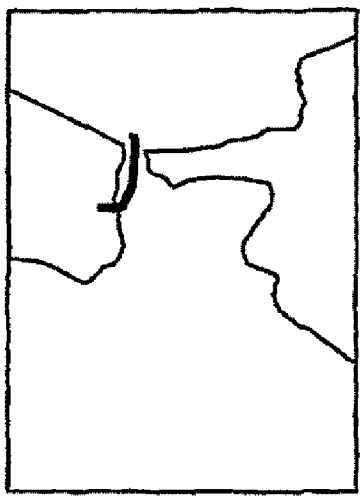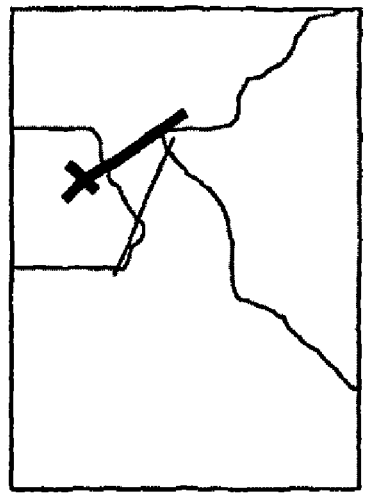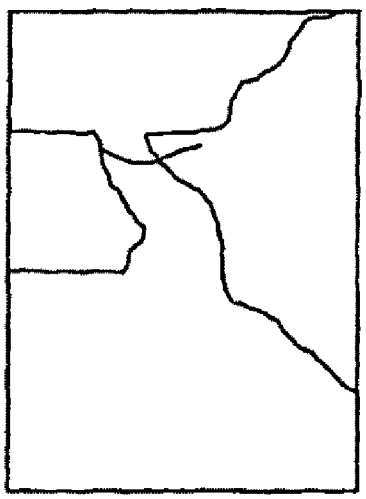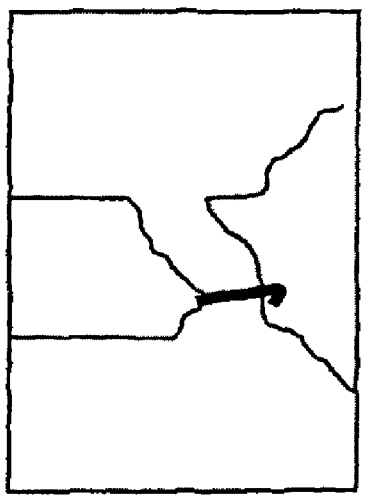

US 8,079,278 B2

END EFFECTOR FOR NANO MANUFACTURING

CROSS-REFERENCE TO RELATED APPLICATIONS

This application is a 371 National Stage of International Application No. PCT/US2006/028540, filed Jul. 21, 2006 and published in English as WO 2007/014095 A2 on Feb. 1, 2007. This application claims the benefit of U.S. Provisional Application No. 60/702,090, filed Jul. 22, 2005. The disclosures of the above applications are incorporated herein by reference.

FIELD

The present disclosure relates generally to micro/nano manipulation and, more particularly, to a micro pneumatic end-effector for micro/nano manipulation.

BACKGROUND

In the nano environment, manufacturing processes which are capable of efficiently assembling nano devices have been studied and investigated by many researchers in the field. The assembly of nano devices involves the movement of nano parts to arbitrary positions (and orientations) and the suitable forces have to be applied to these nano parts/objects. Transporting microfluids and releasing the micro/nano parts/objects precisely at the final position is also very critical.

For macro object/parts, this problem is already solved by mechanical clamps using friction forces or geometrically constraining grippers to hold and move the relatively heavy objects. For small objects, sticking effect becomes more dominant. Compared to the adhesion and electrostatic forces, the weight and inertia of the particle can be neglected because they scale with the cube of the size.

In designing micro/nano tools such as the gripper and end-effector, several major issues must be addressed. First, the operating target is fragile and can easily be destroyed. Therefore, the force acting on the micro/nano tool must be meticulously controlled to effectively hold the target. Unlike macro objects that can be released by their self-gravitation, micro/nano objects need to be released by an active force as the negative pressure vanished. This makes it important that a micro/nano tool exerts an appropriate amount of force on a micro/nano target. Second, the structure of the micro/nano tool must be simple and compact because of small operation workspace. Finally, the micro/nano tool should be easily mounted on the micro/nano robot for microassembly, microfluidic handling/droplet, manufacturing of nano devices, and micro/nano manipulation. In addition, micro/nano tools are very delicate, hence they have to be replaced frequently. As a result of this, efficiency during microassembly, microfluidic handling/droplet, handling of nano devices, and micro/nano manipulation is greatly reduced. For this reason, micro/nano tools have to be simple and cheap.

In micro/nano fluidic handling/droplet, the transport of small amounts of fluids must be controlled with a view to automated drug dosage. The right amount of the fluid must be precisely dropped/released at the desired location/place. Moving fluid through a device or channel, regardless of the application, requires a means of generating flow. Many methods have been presented in recent years including micromechanical, electrowetting, thermocapillary pumping, and electro-osmotic flow. However, none of these methods have feedback. To realize the maximum benefit of micro/nano fluidic devices, it will be necessary to generate flow using devices that are integrated with sensing and feedback.

The statements in this section merely provide background information related to the present disclosure and may not constitute prior art.

SUMMARY

An end-effector is provided for use on a micro/nano manipulation device. The end-effector is comprised of: a micropump fluidly coupled to a microtube; a piezoelectric sensing structure disposed in the microtube; and a processing circuit electrically coupled to the sensing structure for determining the force of the microfluidic flowing through the microtube.

Further areas of applicability will become apparent from the description provided herein. It should be understood that the description and specific examples are intended for purposes of illustration only and are not intended to limit the scope of the present disclosure.

DRAWINGS

FIGS. 7A-7F are diagrams illustrating other exemplary configurations for the sensing structure of the end-effector;

FIGS. 15A-15D are diagrams showing the experimental results verifying the performance of the pneumatic end-effector system.

The drawings described herein are for illustration purposes only and are not intended to limit the scope of the present disclosure in any way.

DETAILED DESCRIPTION

Figure 1:
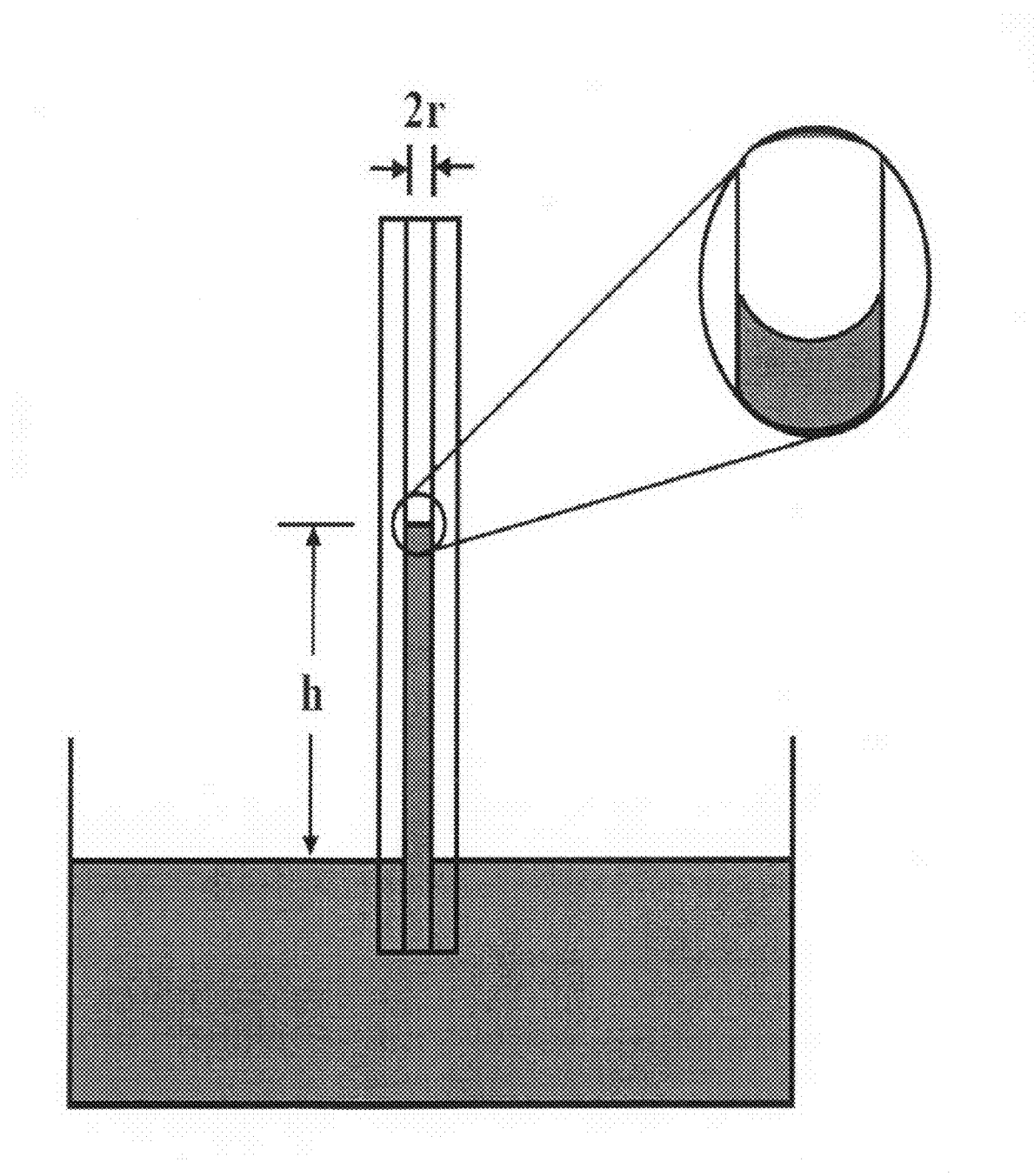
FIG. 1 is a diagram illustrating capillary rise due to surface tension.

Surface tension is a property of liquids arising from unbalanced molecular cohesive forces at or near the surface. As a result of which the surface tends to contract and exhibit properties resembling those of a stretched elastic membrane. Its effects arise from interactions of layers of adsorbed moisture on the two surfaces. Surface tension produces several observable phenomena. The rise of a liquid in a capillary is as a result of surface tension. The force that results from the surface tension is known as capillary force. FIG. 1 illustrates capillary rise due to surface tension in which the end of the capillary tube of radius r, is immersed in liquid. For sufficiently small capillaries, a substantial rise of liquid to height h in the capillary is observed because of the force exerted on the liquid due to surface tension. This force is known as the capillary force, $F_{cap}$. Equilibrium occurs when the force of gravity balances the capillary force. The balanced point can be used as a means to measure the surface tension and can be described by $$\gamma(2\pi r) = \rho h(\pi r^2)g \tag{1}$$

where $\gamma$ is the surface tension of the liquid, r is the radius of the capillary, h is the capillary rise, $\rho$ is the density of the liquid, and g is the acceleration due to gravity. The expression for the surface tension is obtained by rearranging equation (1) as $$\gamma = \frac{1}{2}\rho g r h \tag{2}$$

As shown in FIG. 1, the surface of the capillary is not perfectly flat. Instead it curves up, sometimes down at the wall to form a meniscus as illustrated in the inset in FIG. 1. Taking into account that the material in this region also contributes to the force of gravity, equation (2) (the surface tension) can be expressed as $$\gamma = \frac{1}{2}\rho g r \left(h + \frac{r}{3}\right) \tag{3}$$

Surface tension will always exist whenever there is a density discontinuity as; for example, between water and air or water and oil. The magnitude of the surface tension will depend upon the nature of both substances—liquid and liquid or liquid and gas. In general, surface tension is a function of temperature and pressure.

For a hydrophilic sphere with a diameter d close to a plane, the capillary force $F_{cap}$ can be written as:

$$F_{cap} = \pi \cdot d \cdot \gamma \tag{4}$$

where $\gamma$ is the surface tension of the liquid. Calibration results of surface tension for water and acetone are presented below.

Measuring fluid flow is one of the most important aspects of process control. In this disclosure, accurate flow measurement is critical to determine the pneumatic control of the end-effector. Two of the important flow measurements are the flow speed and flow rate. Usually, flow is generally measured inferentially by measuring velocity (flow speed) through a known area. The Navier-Stokes equations are the basic differential equations describing the flow of incompressible Newtonian fluids. Detail derivation of Navier-Stokes equations can be found in Bruce R. Munson et al., *Fundamentals of Fluid Mechanics*, John Wiley and Sons, Inc., New York.

Figure 2:
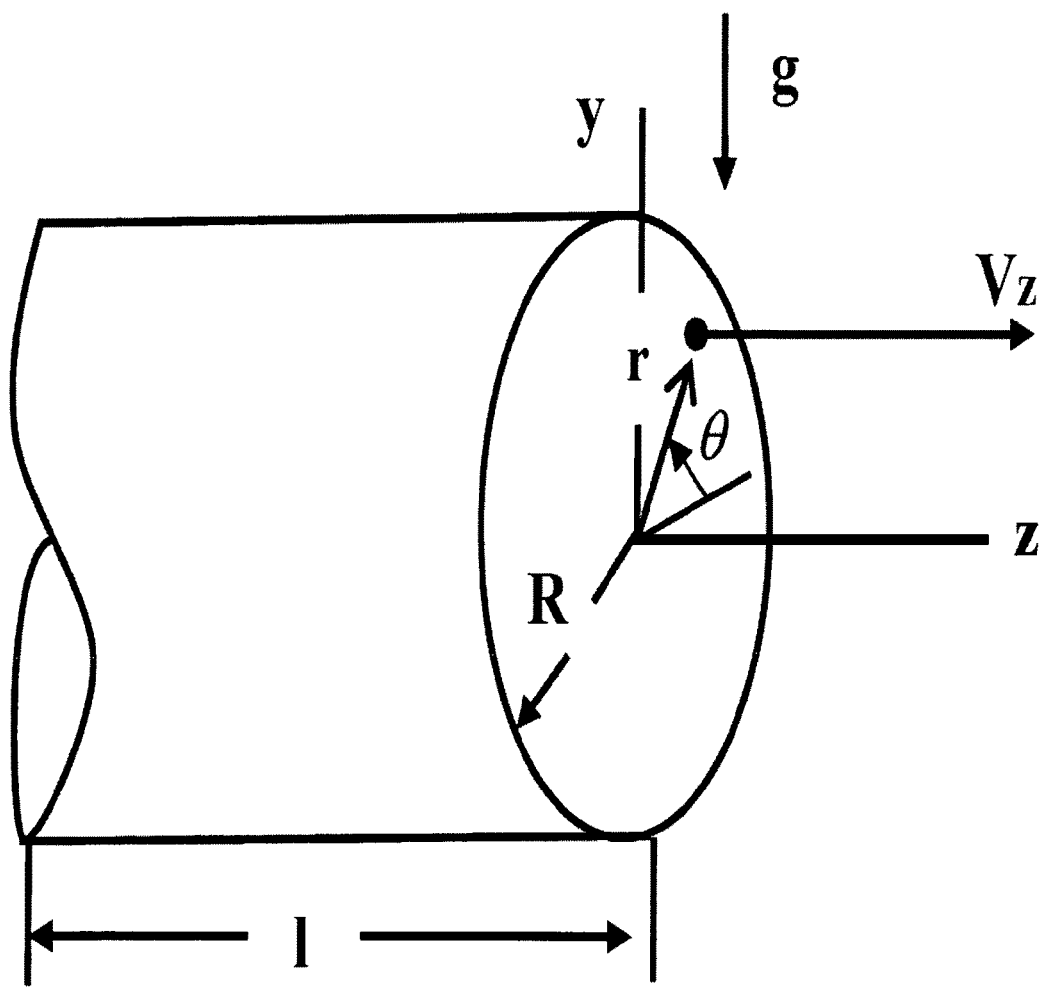
FIG. 2 is a diagram illustrating the viscous flow in a horizontal, circular tube.

The best known exact solutions to Navier-Stokes equations is for steady, incompressible, laminar flow through a straight circular tube of constant cross section. This type of flow is generally known as Poiseuille flow. Considering the flow through a horizontal circular tube of radius R as shown in FIG. 2. Because of the cylindrical geometry, it is convenient to use cylindrical coordinates. Assume the flow is parallel to the walls, so that $$v_r = 0, \text{ and } v_\theta = 0 \tag{5}$$

from a continuity equation [1], $$\frac{\partial v_z}{\partial z} = 0 \tag{6}$$

Also, for steady, asymmetric flow, $v_z$ is not a function of t or $\theta$, so the velocity, $v_z$ is only a function of the radial position within the tube. That is $$v_z = v_z(r) \tag{7}$$

Under the conditions described above, the Navier-Stokes equations reduce to the following:

$$-\rho g \sin\theta - \frac{\partial p}{\partial r} = 0 \tag{8}$$

$$-\rho g \cos\theta - \frac{1}{r}\frac{\partial p}{\partial \theta} = 0 \tag{9}$$

$$-\frac{\partial p}{\partial z} + \mu \left[\frac{1}{r}\frac{\partial}{\partial r}\left(r\frac{\partial v_z}{\partial r}\right)\right] = 0 \tag{10}$$

By integrating equation (8) and (9), we get the following $$p = -\rho g(r\sin\theta) + f_1(z) \tag{11}$$

Equation (11) indicates that the pressure is hydrostatically distributed at any particular cross section, and the z component of the pressure gradient $\partial p/\partial z$ is not a function of r or $\theta$.

Continually, after integrating equation (10), and using the fact that $\partial p/\partial z$ is a constant, the equation of motion in the z direction as illustrated in FIG. 2 is obtained as $$v_z = \frac{1}{4\mu}\left(\frac{\partial p}{\partial z}\right)r^2 + c_1 \ln(r) + c_2 \tag{12}$$

Since we want $v_z$ to be finite at the center of the tube (r=0), it follows that $c_1=0$, hence $c_2$ can be expressed as $$c_2 = -\frac{1}{4\mu}\left(\frac{\partial p}{\partial z}\right)R^2 \tag{13}$$

The volume flow rate through the circular tube is given by $$Q_v = Av \tag{14}$$

where A is the area of the circular tube and v is the flow velocity.

Sequentially, the volume flow rate through the differential area is given by $$dQ_v = v_z(2\pi r)dr \tag{15}$$

Combining equations (13) and (12), and substituting into equation (15), then integrating over the radius of the tube, the expression for volume flow rate as a function of pressure difference is given as $$Q = \frac{\pi R^4 \Delta p}{8\mu l} \quad (16)$$

where $\mu$ is the viscosity of the liquid, $l$ is the length over pressure difference (pressure drop) along the tube. Simulation results are presented below to validate Poiseuille's Law.

Figure 3:
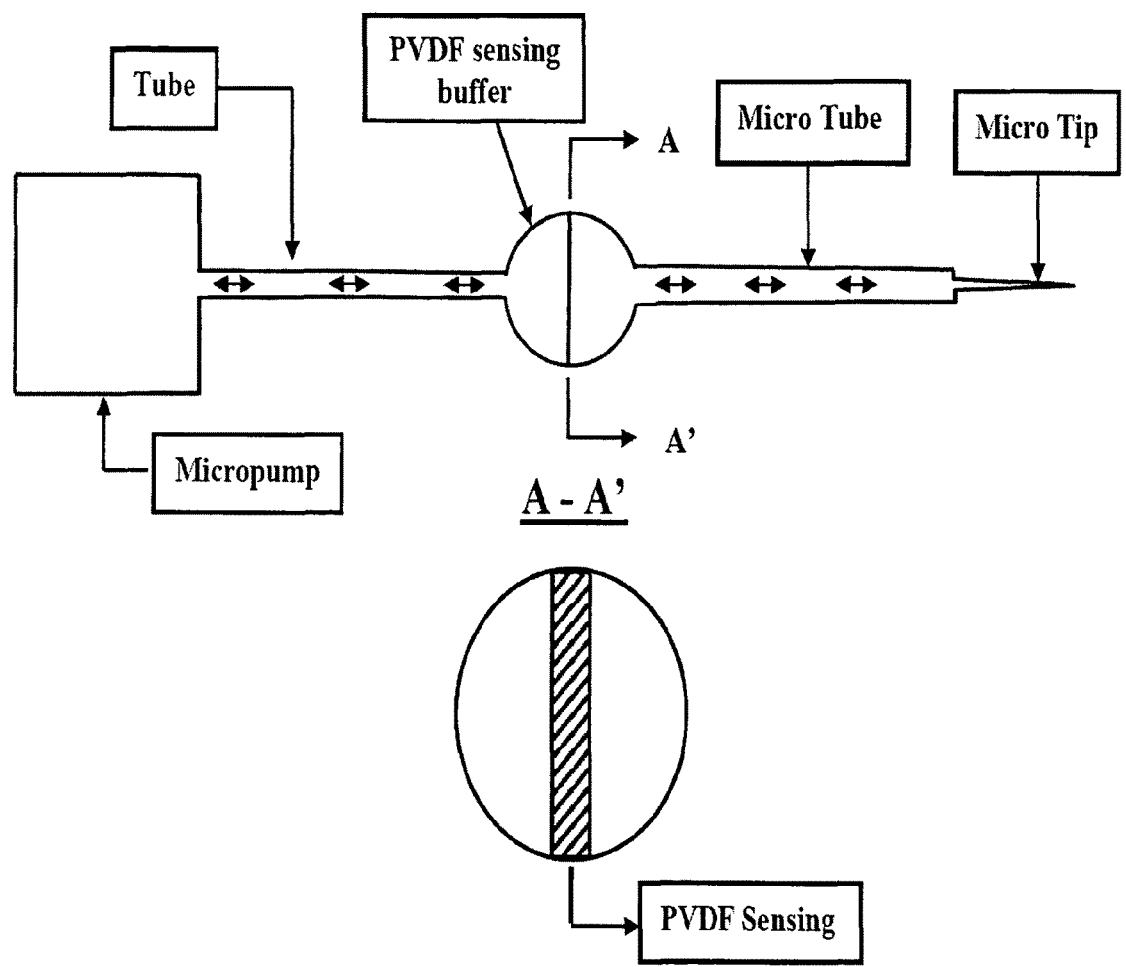
FIG. 3 is a diagram depicting an exemplary design for a microfluidic end-effector system.

FIG. 3 shows an exemplary design for a microfluidic end-effector system 10. The end-effector 10 is comprised of a micropump 12, an inflow micro tube 14, a micro-drag force sensor 16, and a micro tip 18. The micropump is fluidly coupled to one end of the microtube. When voltage is applied to the micropump, the distal end of the microtube can generate a microsuction or pressure force due to the vacuum or pressure action provided by the micropump. An exemplary micropump operates at a maximum vacuum of $51.5 \times 10^3$ N/m$^2$ and maximum continuous pressure of $40 \times 10^3$ N/m$^2$. The flow rate of the micropump may be between 4.1667 $\mu$m$^3$/s and 7.5 $\mu$m$^3$/s. An exemplary microtube is commercially available from KNF Neuberger Inc.

The microtube is very lightweight, semi-flexible, and is used for a variety of laboratory applications. The micro tube is preferably heat resistant to 500° C. continuous. In addition, it is highly valued for its toughness and insulating qualities as well as high dielectric strength over a wide range of frequencies. Most importantly, the micro tube is non-absorbent to water and unaffected by acids and alkalis. In an exemplary embodiment, microtube is made of a polytetrafluoroethylene (PTFE) material and having an inner diameter of 254 $\mu$m. It is understood that microtubes having different dimensions and/or made of different materials are also within the scope of this disclosure.

A force sensor made of a piezoelectric material is disposed in the microtube. More specifically, the microtube provides a sensing cavity 19 (i.e., buffer) having a cross-sectional area larger than the cross-sectional area of the remainder of the tube. The force sensor is a thin beam affixed to an inner surface of the sensing cavity and extending into the sensing cavity. In some instances, the beam will extend substantially across the sensing cavity as shown in FIG. 3. In this way, the force sensor is able to detect the force acting thereupon. The detected microforce is in turn related to the micro suction/pressure acting at an end of the microtube distal from the micropump. A sensing model for the end-effector system is further developed below.

Figure 4:
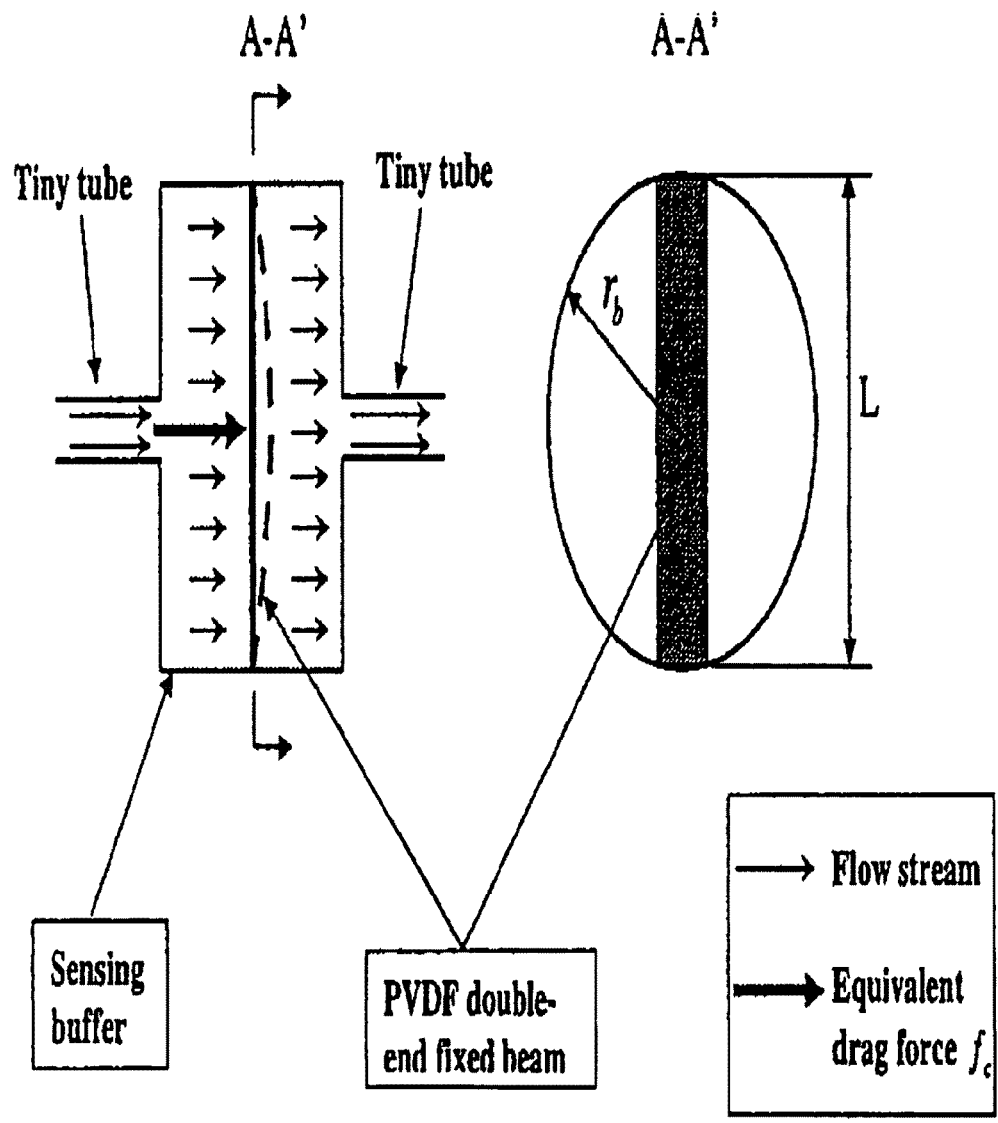
FIG. 4 is a diagram depicting a sensing beam affixed on both ends to the inner surface of the sensing buffer.

FIG. 4 illustrates a sensing beam affixed on both ends to the inner surface of the sensing buffer. Due to the high sensitivity of polyvinylidene fluoride (PVDF) material, the sensing beam employs a two-layer composite structure having a PVDF layer and a polyester layer. It is envisioned that other types of piezoelectrical materials may be employed as well as other plastic materials with the property of high elasticity. The deformation of the sensor beam is caused by the flow stream acting at the whole beam in the sensing buffer. The resulting deformation can also be equivalently made by a drag force (suction/pressure) acting at the middle of the double-end fixed beam strip(s) in the sensing buffer.

Following the geometry characteristic of the PVDF strip, since the beam is much wider and longer than the thickness, the strain along the width of the beam can be assumed to be zero. With the above descriptions, based on piezoelectric transverse effect, the unit piezoelectric equation is: (without considering the inverse piezoelectric affection and pyroelectric effects):

$$D_3(r,t) = d_{31}\sigma_s(r,t) \quad (17)$$

where $D_3(r, t)$ is the normal electric displacement of PVDF film, $0 \leq r \leq L$. $d_{31}$ is the transverse piezoelectric coefficient and $\sigma_s(r, t)$ denotes the unit stress on the PVDF strip along the length.

The surface area polarization gives a charge $Q_s(t)$ across the PVDF sensing surface area $S_A(L \times W)$:

$$Q_s(t) = \int D_3(r,t) dS_A \quad (18)$$
$$= \int \int_{S_A} D_3(r,t) dy dr$$

Using the mechanics of materials for beam, as shown in FIG. 4, the unit stress on the surface of the half PVDF sensing beam can be obtained if the external force $f_c(t)$ acts at the middle of the beam in the sensing buffer.

$$\sigma_s(r,t) = -cE_p \frac{\partial^2 \omega_s(r,t)}{\partial r^2} \quad (19)$$

According to FIG. 4, notice that we omit the effect of thin electrode layers at the top and bottom surfaces of PVDF layer. c is the distance between the middle of the PVDF sensing layer and the neutral axis $c_n$ of the beam. $\omega_s(r, t)$ is the elastic deflection of the flexible composite beam caused by the micro force $f_c(t)$ at the middle of the beam.

Since the bending charge is the same along the width of PVDF ($s_y$=0), we can rewrite equation (18) as:

$$Q_s(t) = \int_0^L d_{31}\sigma_s(r,t)Wdr \quad (20)$$
$$= -cE_p d_{31} W \frac{\partial \omega_a(r,t)}{\partial r}\bigg|_0^L$$

Sequentially, a simplified and effective equivalent circuit model of a capacitor $C_P$ can be used to represent the model of the PVDF sensing layer. The output voltage $V_s(t)$ of the PVDF sensing layer caused by the micro force can be described by $$V_s(t) = \frac{Q_s(t)}{C_P} \quad (21)$$

By Laplace transformation, the electrical open-circuit transfer function of the PVDF sensing layer is given as:

$$V_s(s) = \frac{Q_s(s)}{C_P} \quad (22)$$

To find the dynamic relationship between the sensing output $V_s$ and the micro suction/pressure force A acting at the middle of the beam, first describe a dynamic model of the flexible PVDF sensor beam based on the partial differential equation. Here, the PDE describing the elastic deflection of the flexible PVDF sensor is a Bernoulli-Euler equation as follows:

$$EI\frac{\partial^4 \omega_s(r,t)}{\partial r^4} + \rho A\frac{\partial^2 \omega_s(r,t)}{\partial t^2} = f_c(t)\delta\left(r - \frac{L}{2}\right) \quad (23)$$

where E, I, L and ρ represent the Young's modulus, inertia moment, length of beam and linear mass density of the beam. $f_c(t)$ is the external suction/pressure force acting at the middle of the beam, which can be detected by the PVDF sensing strip. δ(.) denotes the Dirac delta function.

The boundary conditions for the above equation are:

$$\omega_s(0,t) = 0 \quad (24)$$

$$EI\frac{\partial \omega_s^2(0,t)}{\partial r^2} = 0 \quad (25)$$

$$\omega_s(L,t) = 0 \quad (26)$$

$$EI\frac{\partial \omega_s^2(L,t)}{\partial r^2} = 0 \quad (27)$$

By using the modal analysis method, we assume that the deformation of the beam has infinite shape modes, then the deflection $\omega_s(r,t)$ can be expressed as an infinite series in the following form:

$$\omega_s(r,t) = \sum_{i=1}^{\infty} \Phi_i(r)q_{si}(t) \quad (28)$$

where $\phi_i(r)$ are the eigenfunction satisfying the ordinary differential equation and $q_{si}(t)$ are the modal displacements caused by the micro force. Then the deflection mode shapes are assumed to be:

$$\Phi_i(r) = C_1\sin(\alpha_i r) + C_2\cos(\alpha_i r) + C_3\sin h(\alpha_i r) + C_4\cos h(\alpha_i r) \quad (29)$$

Substituting the above equations (28) and (29) into the boundary conditions (24)~(27), we found $\alpha_i$ is the infinite set of eigenvalues yielded by $$\alpha_i L = i\pi \quad i = 1, 2, \ldots \quad (30)$$

and also, the natural frequencies $\omega_i$ of the sensor beam correspond to the $\alpha_i$ by $$\omega_i = (i\pi)^2\sqrt{\frac{EI}{\rho A L^4}} \quad (31)$$

In order to determine the dynamics of the system, we use Lagrange's equation of motion by $$\frac{d}{dt}\frac{\partial(E_{sk} - E_{sp})}{\partial \dot{q}_{si}} - \frac{\partial(E_{sk} - E_{sp})}{\partial q_{si}} = Q_i \quad (32)$$

Here, $E_{sk}$ is the kinetic energy $E_{sp}$ represents the potential energy and $Q_i$ is the generalized nonconservative forces related to the external micro force. They are $$E_{sk} = \frac{1}{2}\int_0^L \dot{\omega}_e(r,t)^2 \rho A dr \quad (33)$$

$$E_{sp} = \frac{1}{2}\int_0^L EI\omega_s''(r,t)^2 dr \quad (34)$$

$$Q_i = f_c(t)\Phi_i\left(\frac{L}{2}\right) \quad (35)$$

where a prime indicates the derivative with respect to position and a dot denotes the derivative with respect to time.

Using the Lagrange's equation of motion (32) and (31), we have the differential equation corresponding to each shape mode of the sensor beam to be $$EI\alpha_i^4 q_{si}(t) + \rho A\ddot{q}_{si}(t) = f_c(t)\Phi_i\left(\frac{L}{2}\right) \quad (36)$$

Then by the Laplace transformation of the above equation, the dynamic relationship between the modal displacements $q_{si}(s)$ and the external micro force is given as $$q_{si}(s) = \frac{f_c(s)\Phi_i\left(\frac{L}{2}\right)}{\rho A(s^2 + \omega_i^2)} \quad (37)$$

Based on equations (20) and (22), since $\omega_s(r,s) = \sum_{i=1}^{\infty}\Phi_i(r)q_{si}(s)$, by Laplace transform of equation (20), $Q_s(s)$ can be represented as $$Q_s(s) = -cE_p d_{31} W\omega_s'(r,s)|_0^L \quad (38)$$
$$= -cE_p d_{31} W\sum_{i=1}^{\infty}[\Phi_i'(L) - \Phi_i'(0)]q_{si}(s).$$

Substituting equation (38) into equation (22), then we have $$V_s(s) = C_s\sum_{i=1}^{\infty}[\Phi_i'(L) - \Phi_i'(0)]q_{si}(s) \quad (39)$$

where $$C_s = \frac{-cE_s d_{31} W}{C_p}$$

Subsequently, by combining equations (37) and (39), we have the dynamic sensing model, which denotes the dynamic relationship between the output voltage $V_s$ of PVDF sensing beam and the external micro suction/pressure force $f_c$ at the middle of the beam in the sensing buffer as follows:

$$\frac{V_s(s)}{f_c(s)} = C_s\sum_{i=1}^{\infty}\left\{\frac{[\Phi_i'(L) - \Phi_i'(0)]\Phi_i\left(\frac{L}{2}\right)}{\rho A(s^2 + \omega_i^2)}\right\} \quad (40)$$

Figure 5:
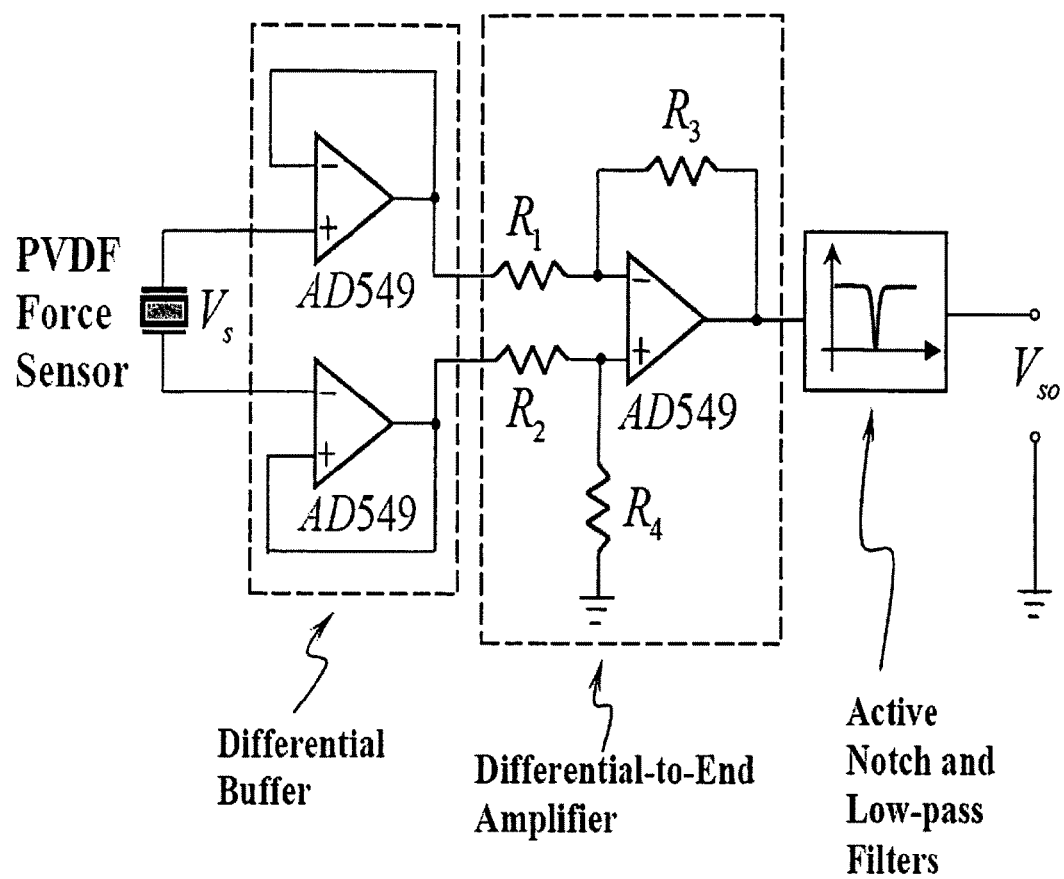
FIG. 5 is a schematic of an exemplary processing circuit for interfacing with the for sensor of the end-effector.

To achieve the sensing voltage $V_s$, the PVDF sensing beam is interfaced with a processing circuit as shown in FIG. 5. In particular, sensing beam is interfaced though an interface circuit 50 to an analog/digital input/output board PCI-DAS4020/12 residing in a personal computer. Briefly, the interface circuit 50 is comprised of a differential buffer 52, a differential amplifier circuit 53, and an active notch and low-pass filters 54. The buffer circuit 52 is constructed using the ultralow input bias current operational amplifier AD549 with a high input impedance $R_{in}=1013$ and low bias current $150 f_A$. Notice that $R_3=R_4$ and $R_1=R_2$. The amplifier circuit 53 is used to buffer the open circuit voltage $V_s$ of the sensing beam, and can convert the high impedance signal generated by the PVDF sensing beam to a low impedance voltage suitable for convenient coupling to the acquisition board. The circuit output $V_{so}$ is an amplified and filtered approximation of the voltage $V_s$ and can be sampled by the acquisition board to the PC. To further remove the 60 Hz noise from the data acquisition system, a zero phase notch filter is added in the data collection system. It is envisioned that other type of interface circuits may be employed.

Finally, by considering the whole sensing system, the global transfer function is $$\frac{V_{so}(s)}{f_c(s)} = C_b C_s \sum_{i=1}^{\infty} \left\{ \frac{[\Phi_i'(L) - \Phi_i'(0)]\Phi_i\left(\frac{L}{2}\right)}{\rho A(s^2 + \omega_i^2)} \right\} \quad (41)$$

where $$C_b = \frac{R_3}{R_1} \frac{sR_{in}C_P}{1+sR_{in}C_P}.$$

Based on this dynamic equation, we can obtain the micro drag force $f_c$ by measuring the output voltage $V_{so}$ of the sensing beam when the initial values of $f_c(t_o)$ and $V_{so}(t_o)$ are known.

In addition, the drag force achieved from equation (41) is the suction/pressure force in the sensing buffer. In order to get the suction/pressure force or flow rate at the end of the microtube, assume the air pressure P caused by the pump is the same in the tube end and in the sensing buffer. Then by the equation $$f_s = \frac{P}{A_s}, f_c = \frac{P}{A_c} \quad (42)$$

Rearranging equation (42) and solving for the suction/pressure force $f_s$ at the free tube end (end-effector), we have $$f_s = \frac{A_c}{A_s} f_c \quad (43)$$

where $A_s$ is the cross section area of the inner tube end and $A_c$ is the cross section area of the sensing buffer. Equation (43) can be used for detecting the suction/pressure force at the tube end (end-effector). Given the force at the end of the tube, a closed-loop control system can be implemented for controlling the fluid force generated by the micropump and thus the force at the end of the microtube.

Measuring fluid flow is one of the most important aspects of process control. In this invention, accurate flow measurement is critical to determine the pneumatic control of the end-effector. Two of the important flow measurements is the flow speed and flow rate. Usually, flow is generally measured inferentially by measuring velocity through a known area. With this indirect method the flow measured is the volume flow rate, $Q_v$, stated in its simplest terms:

$$Q_v = A_v \quad (44)$$

Where A is the cross sectional area of the pipe/buffer. V is the flow speed. For our invention, we assume the density of flow in the system is constant, then from Equation of Continuity:

$$Q_v = A_1 v_1 = A_2 v_2 \quad (45)$$

It demonstrates for steady, uniform flow, a decrease in pipe/buffer diameter results in an increase on flow rate.

Since the sensing buffer is closely connected with two same-size tiny tubes, the PVDF beam in the middle of the buffer will serve as an in-buffer target flow meter when the equivalent drag force $f_c$ is achieved. The obtained drag force by the PVDF sensing beam is reasonably assumed to be proportional to the volume or mass flow through the buffer, then we have the following relationship between the force $f_c$ and flow speed $v_b$ in the sensing buffer $$f_c = \left(\frac{v_b^2}{2}\right) \rho_f C_d A_b \quad (46)$$

where $\rho_f$ is fluid density, $C_d$ represents the friction coefficient of the impacting beam area $A_b = L \times W$. The above equation indicates the sensing beam can measure the flow rate in the sensing buffer either. By the continuity law, we have $$Q_v = A_c v_b = A_s V_t \quad (47)$$

Subsequently, the relationship between the measured drag force $f_c$ and the flow speed $v_t$ in the tube can be obtained as $$f_c = \left(\frac{A_s}{A_c}\right)^2 \left(\frac{v_t^2}{2}\right) \rho_f C_d A_b \quad (48)$$

The above equations and relationships are essentially necessary for achieving accurate flow speed and flow rate in the applications of precise micro-dispensing, drug delivery, droplet control, diluter etc. by a micro/nano manipulation system.

Figure 6:
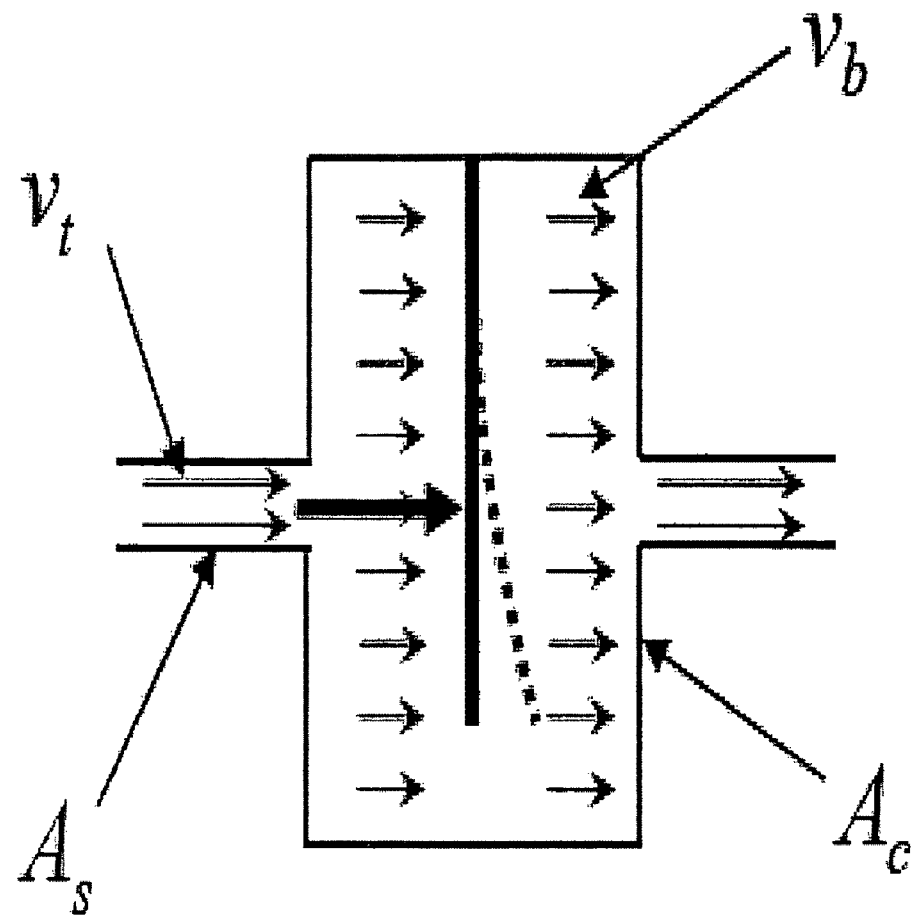
FIG. 6 is a diagram depicting another exemplary sensing beam affixed only on one end to the inner surface of the sensing buffer.

FIG. 6 illustrates another exemplary sensing beam which is only affixed on one end to the inner surface of the sensing buffer. A dynamic sensing model for this sensing beam may be derived in a similar manner as described above. Moreover, it is contemplated that the sensing structure may be comprised of multiple sensing beams or sensing arrays. A few exemplary configurations are further shown in FIGS. 7A-7F. Likewise, a dynamic sensing model may be derived for each of these sensing structures in the manner described above. Other configurations are also within the broader aspects of this disclosure.

Figure 8:
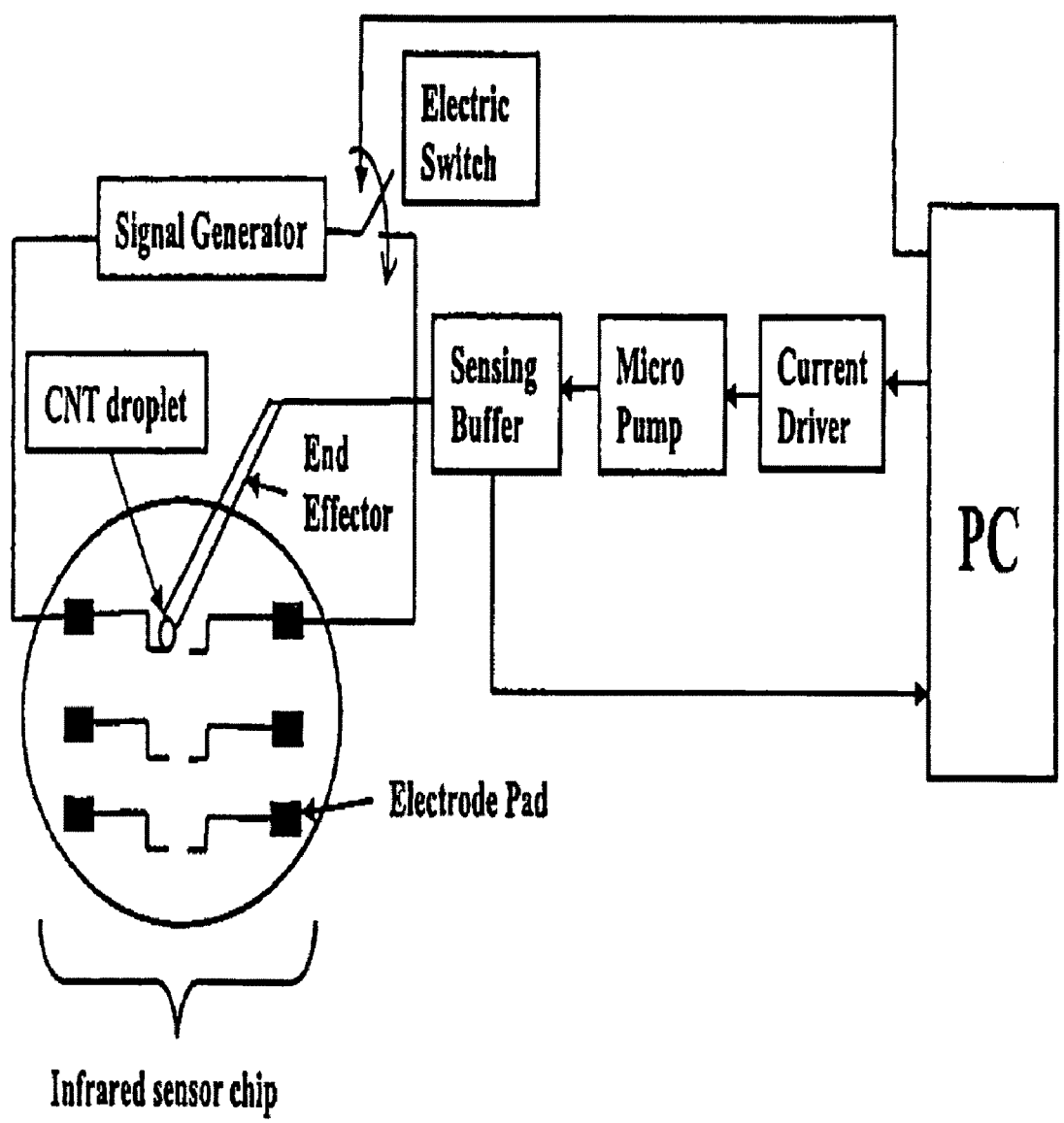
FIG. 8 is a block diagram depicting an experimental implementation setup for nano manufacturing.

FIG. 8 depicts an experimental implementation setup for a micro/nano manipulation system. The manipulation system is generally comprises of a pneumatic end-effector constructed in the manner described above and coupled to a movable member (e.g., a robot). The processing circuit for the force sensor is in data communication with a microcontroller which is in turn able to control the fluid force generated by the micropump based on the fluid force measured by the force sensor. The microcontroller is able to determine the fluid force and/or flow rate at the end of the microtube in accordance with the dynamic sensing models described above and adjust the fluid force generated by the micropump accordingly.

In this exemplary implementation, the system is used to precisely drop carbon nanotube(s) between two electrodes on an infrared sensor chip. In order to achieve the bidirectional (sucking/droplet) flow, the micro pump is interfaced with a current driver. The current driver is a SN754410 quadruple high current half-H driver. It is designed to provide bidirectional drive currents up to 1 A at voltages up to 36V. The current driver is designed for operation from −40° C. to 85° C. By using this current driver, we do not have to reverse the polarity of the micro pump during experiment for either sucking or releasing/droplet.

Figure 9A:
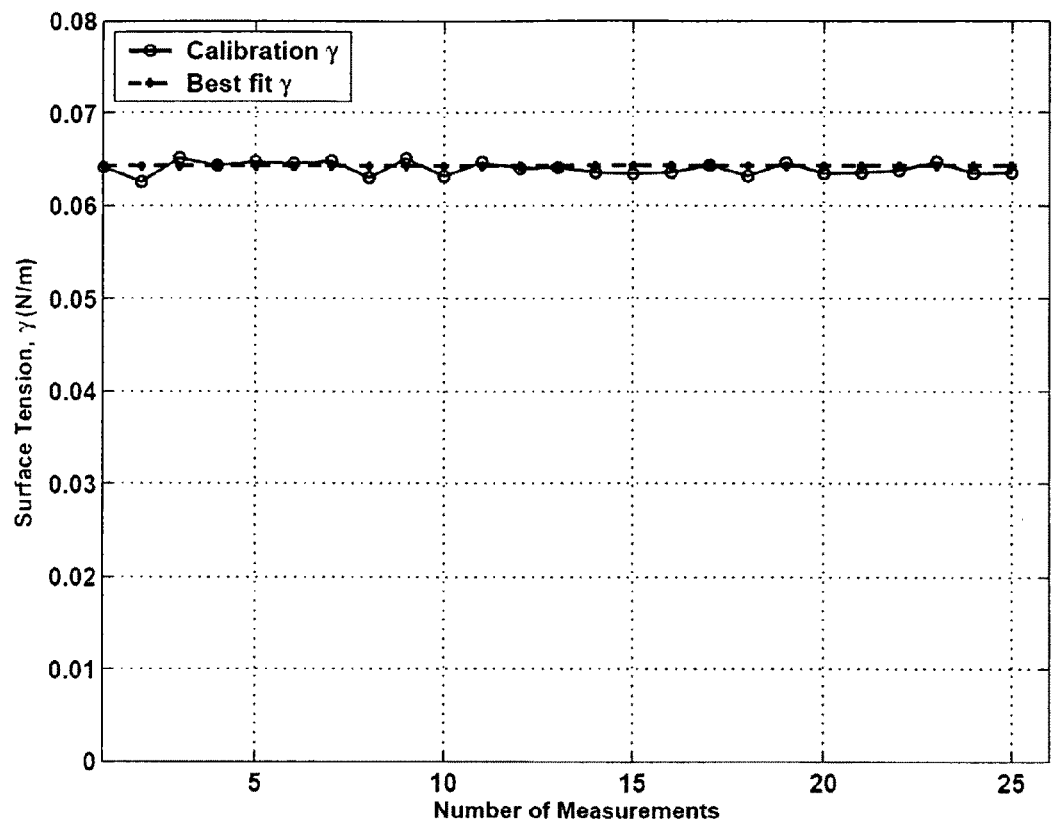
FIGS. 9A and 9B are diagrams illustrating the relationship between volume flow rate and differential pressure for water and acetone, respectively.
Figure 9B:
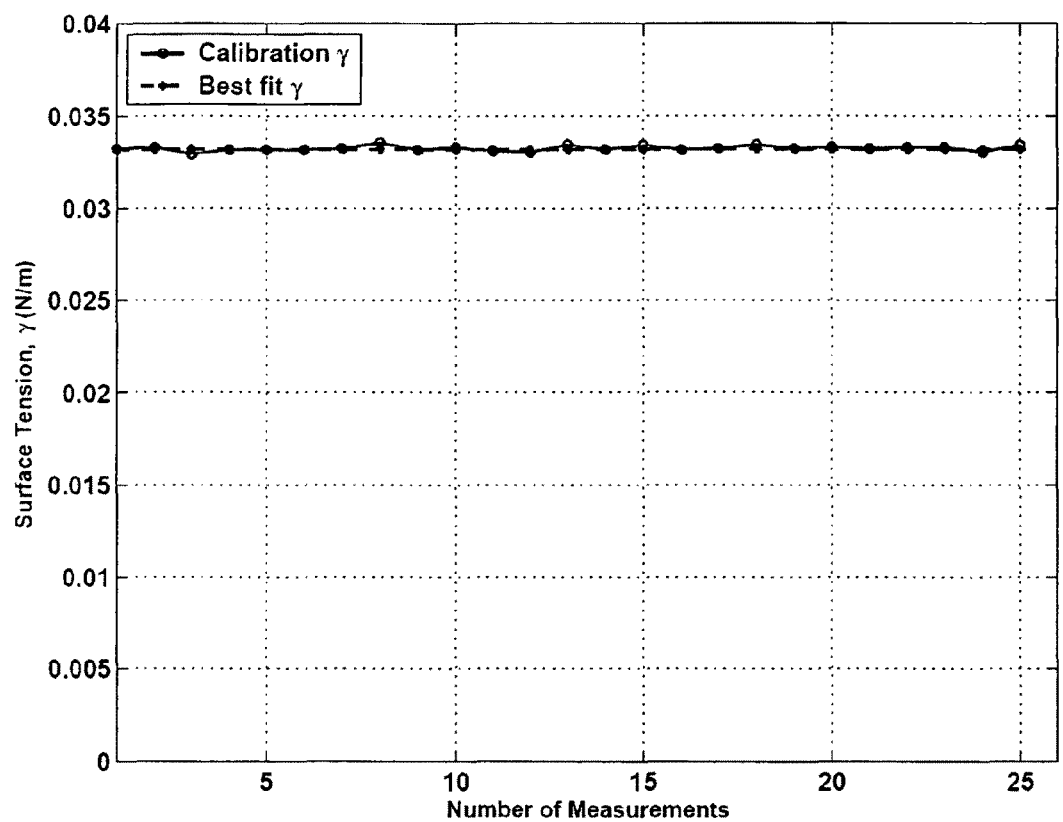
Figure 10A:
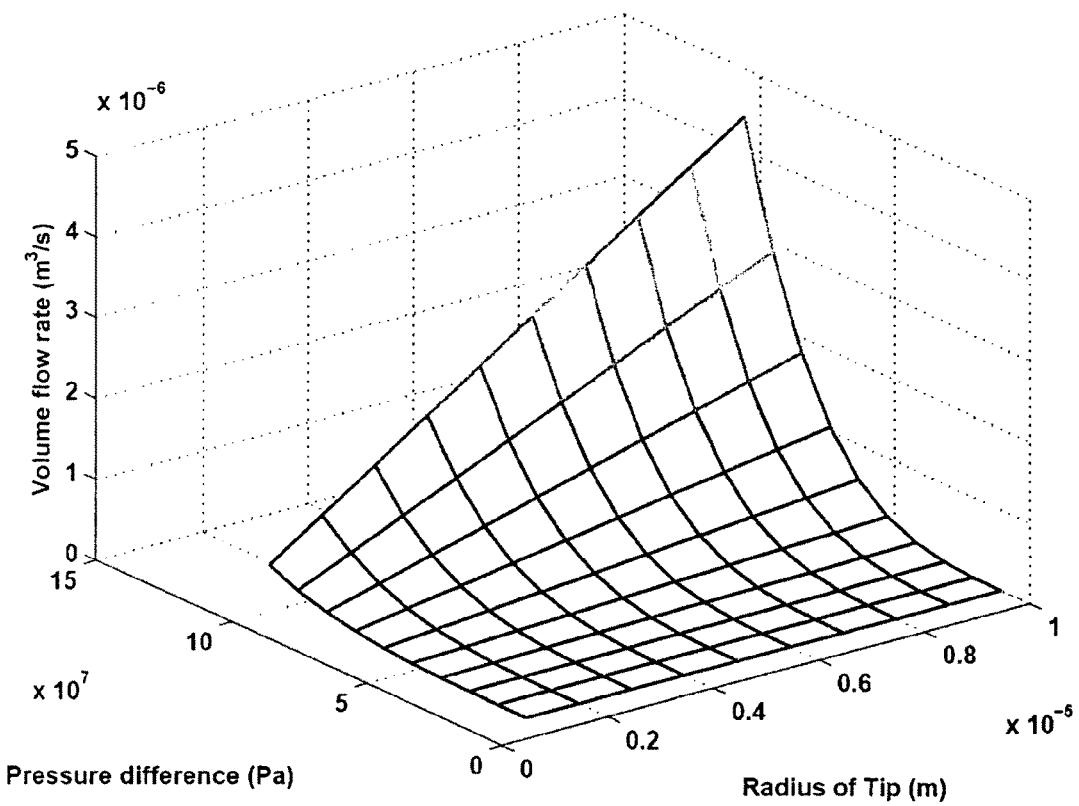
FIGS. 10A and 10B are three-dimensional plots illustrating the relationship between volume flow rate, radius of the microtube, and pressure differential for water and acetone, respectively.
Figure 10B:
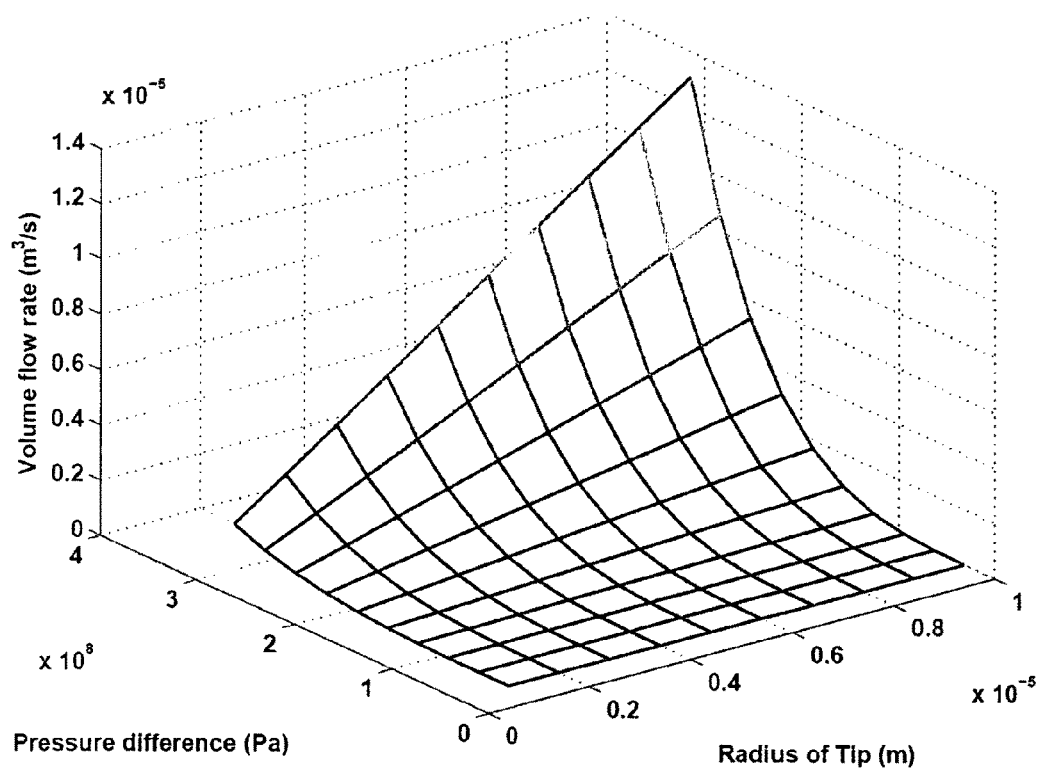

To validate Poiseuille's law, a simulation was done using the parameters of the DC micro-diaphragm pump. The maximum volume flow rate of the micropump is between 4.1667 $\mu m^3/s$ and 7.5 $\mu m^3/s$. Based on this information and using Poiseuille's law, equation (16), we can get the relationship between volume flow rate and differential pressure as illustrated in FIGS. 9A and 9B. As shown, there is a linear relationship between volume flow rate and differential pressure. FIGS. 10A and 10B show a 3D plot showing the relationship between volume flow rate, radius of tube and pressure difference. This simulation was done using the parameters of two liquids, water and acetone. The viscosity of water is $890 \times 10^{-6}$ $Ns/m^2$ and acetone is $300 \times 10^{-6}$ $Ns/m^2$. In the simulation, the pressure differential length, I, in equation (16) is $1 \times 10^{-3}$ m.

Figure 11A:
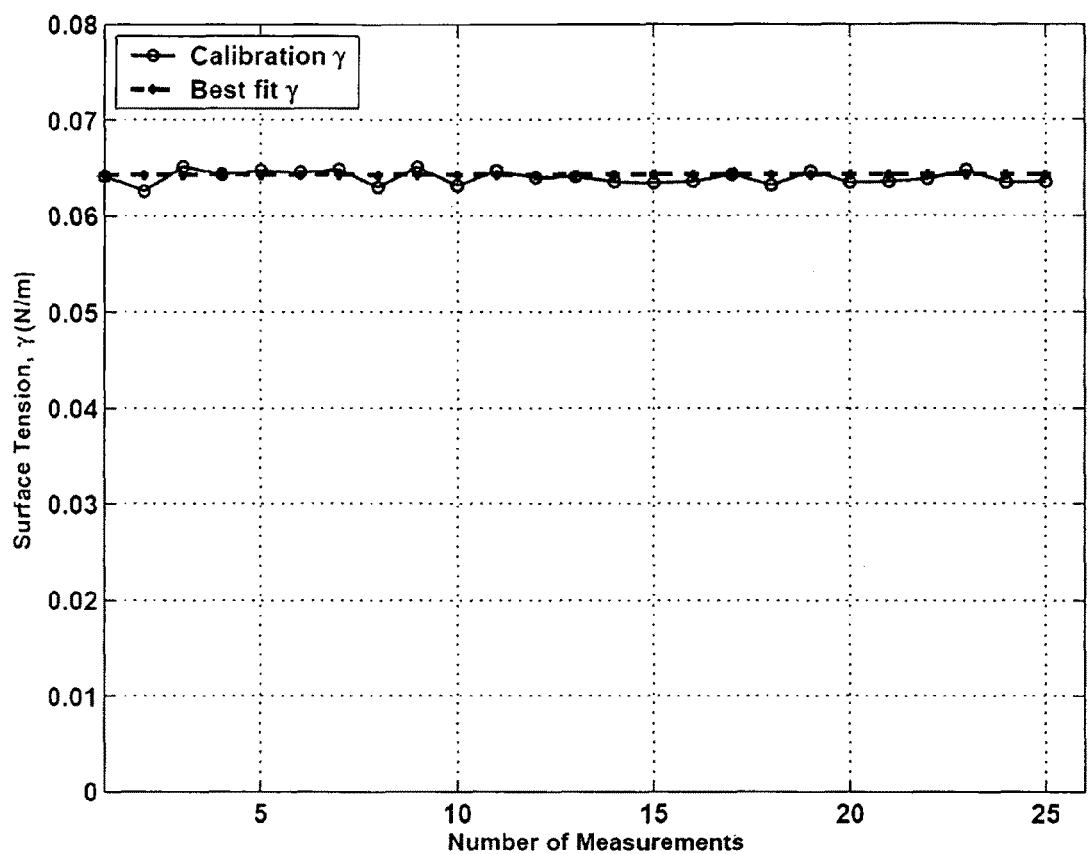
FIGS. 11A and 11B are diagrams illustrating the results of surface tension calibration for water and acetone, respectively.
Figure 11B:
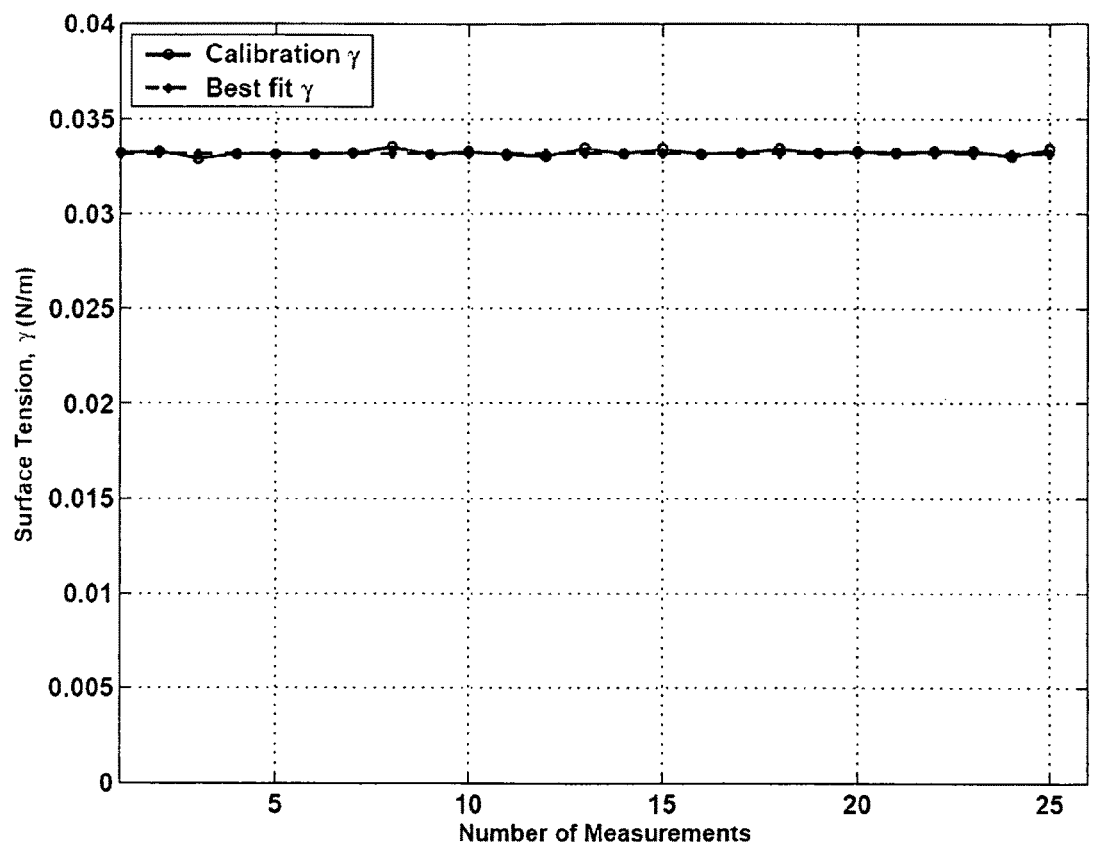

In order to achieve accurate experimental results, surface tension calibration was done on both liquids. FIG. 11 shows the results of surface tension calibration. FIG. 11A illustrates the surface tension for water at 28° C.; whereas, FIG. 11B illustrates acetone at 29° C. The experimental tests were conducted on a micro robotic system at stable room temperature and controlled by a PC-based control system. For this experiment, the sensing structure of the end-effector is as described above in relation to FIGS. 3 and 4. The sensor beam has the following dimensions and parameters: L=0.0212 m, W=0.004 m, h=28 $\mu$m (PVDF film), $C_p$=0.90×10$^{-9}$ F, E=2× 10$^9$ N/m$^2$, $\rho$=1.911×10$^{-3}$ Kg/m$^2$. Lastly, to reduce the vibrations from the environment, an active vibration isolated table is used during the experiment. The resolution of the sensor is in the range of sub-$\mu$N. The output dynamic range of the sensor is 84.3 dB.

Figure 12:
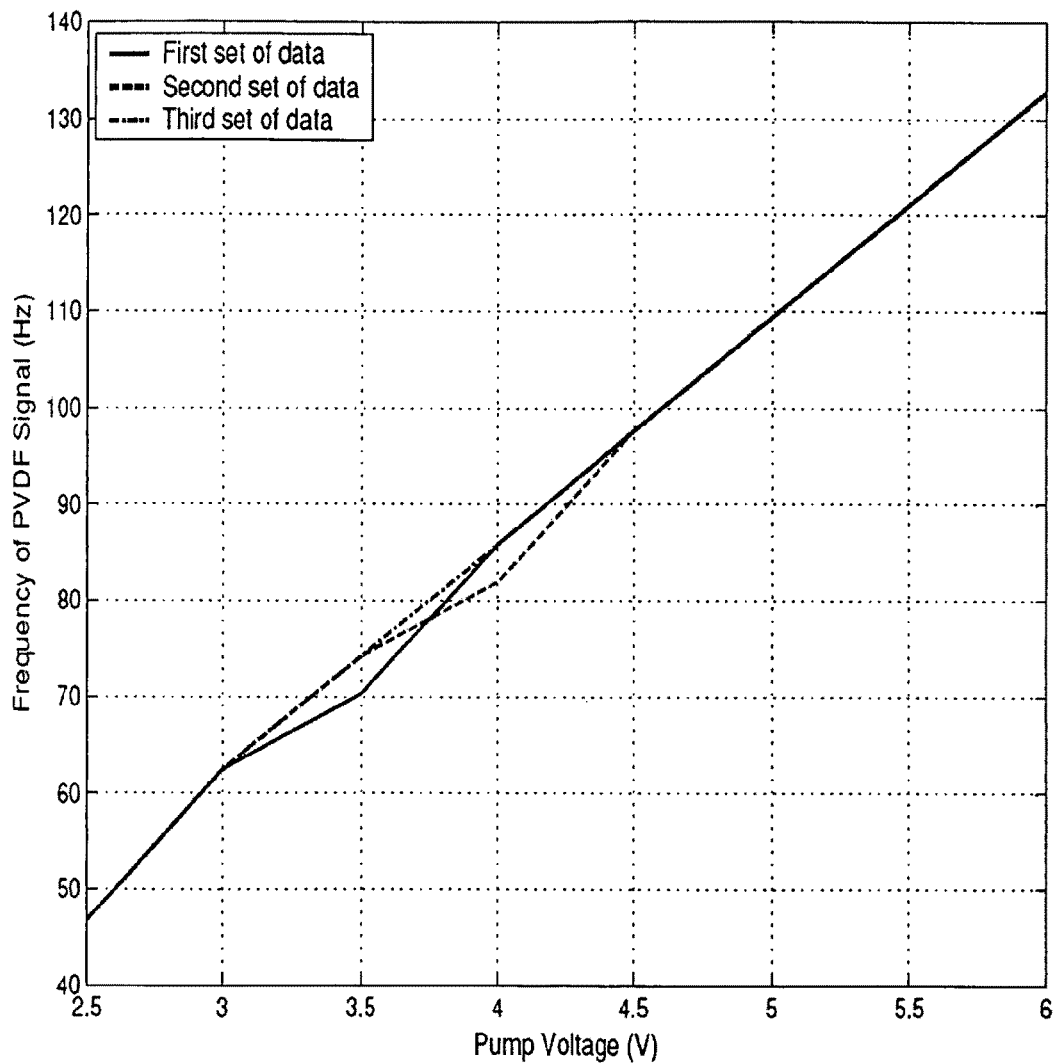
FIG. 12 is a graph illustrating the frequency response of the force sensor to the force signal.

FIG. 12 shows the experimental frequency response of the PVDF micro-drag force sensor to the force signal. The force signal is generated by micropump. The experiment was conducted three times and the results verify that the micro-drag force PVDF sensing is repeatable. The results indicate that the micro-drag force PVDF sensor has fast response to the suction/pressure force caused by the pump voltage and demonstrates the proportional relationship between the force signal frequency and the applied voltage to pump.

The experimental trial to drop carbon nanotube(s) between two electrodes is shown in the table below.

| Trials | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Region | x | 1 | 1 | 2 | 3 | 2 | 1 | 3 | 3 | x | 2 | 1 | x | 2 |

Figure 13:
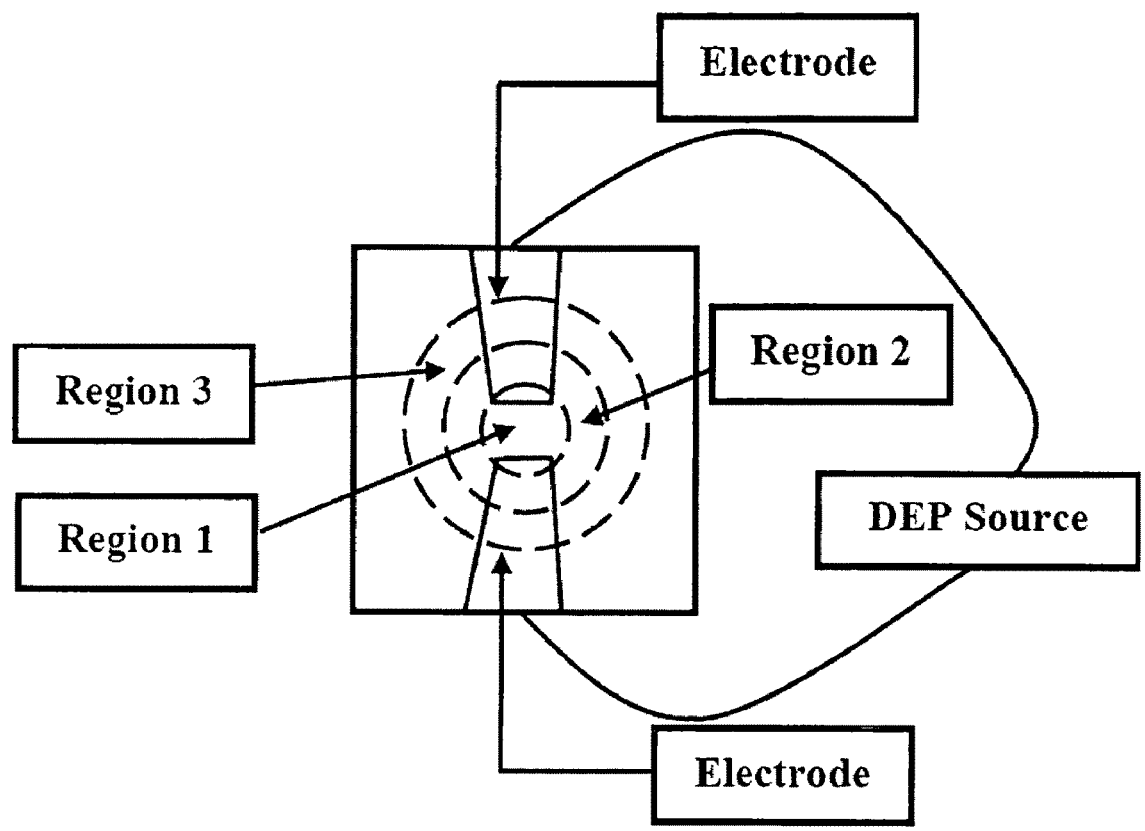
FIG. 13 is a diagram showing the regions in an electrode where a carbon nanotube was dropped using the experimental setup.
Figure 14C:
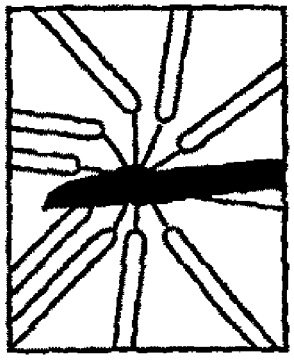
FIGS. 14A-14F are diagrams depicting a procedure for manufacturing nano devices.
Figure 14B:
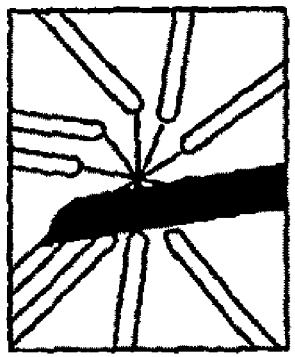
Figure 14A:
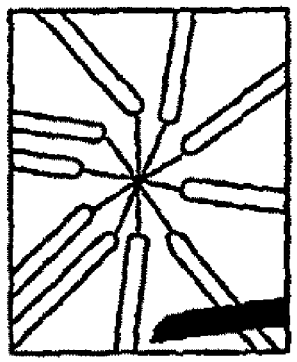
Figure 14F:
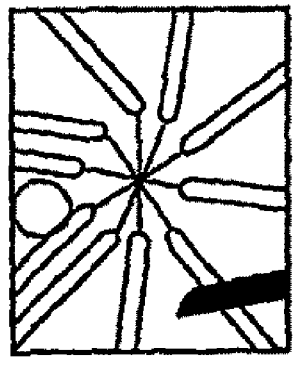
Figure 14E:
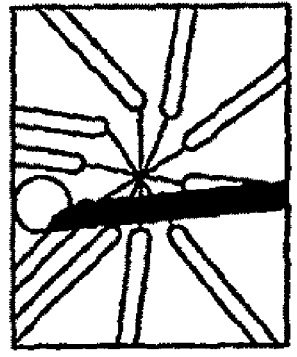
Figure 14D:
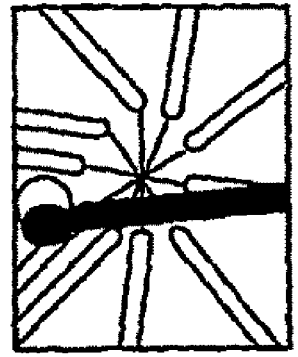

The experiment was conducted 14 times. The x in the table signifies no CNT was dropped between the electrodes for that particular trial. FIG. 13 shows the regions in the electrode where CNT was dropped using the new pneumatic end effector on the infrared sensor chip. Regions 1, 2, and 3 have diameters 2.31 $\mu$m, 3.58 $\mu$m, and 4.77 $\mu$m, respectively. Using the new pneumatic end effector, carbon nanotube(s) were successfully dropped between the electrodes 11 times. The experimental time is also very short.

FIG. 14 depicts the procedure used for the handling of nano devices such as carbon nanotube(s). It is important to know that the handling procedure is automatic, and the software used is written in visual C++. The tip has an internal diameter (ID) of 20 $\mu$m. In FIG. 14, (a) is the initial position of the tip, (b) is when the tip automatically moves to the handling position on the infrared sensor chip as shown in FIG. 8, (c) is when the CNT mixed with acetone is in process of being dropped between the electrode, (d) shows the CNT on the tip of the micro tip, (e) shows when the CNT is dropped on the electrode gap, and (f) is when the micro tip automatically comes back to the starting position.

FIG. 15 shows the experimental result verifying the performance of the new pneumatic end effector system for microfluidic handling and handling of nano devices. The pneumatic end effector is used to precisely drop carbon nanotube(s) between two electrode layers on an infrared sensor chip. In FIGS. 15A, 15C, and 15D, the gap between the electrode is 2.43 $\mu$m, and the gap between the electrode in FIG. 15B is 1.88 $\mu$m. The success rate of this experiment was estimated to be 79%.

This disclosure presents the development of a pneumatic end effector technology with in-situ PVDF beam force sensing for micro robotic manipulators. This end effector is used for micro/nano manipulation and microassembly, and has potential application for MEMS/NEMS assembly, biomanipulation, blowing or delivering microfluid drops and drug delivery. The dynamic microsuction force sensing model is developed based on a beam fixed at both ends. However, similar models can be developed for other beam configurations. Experimental test results verify the feasibility of the developed pneumatic end effector. Ultimately, the technology will provide a critical and major step towards the development of automated delivering of micro fluid drops and enhance micro/nano manipulation and the assembling of micro/nano devices.

What is claimed is:

1. An end-effector for use on a micro/nano manipulation device, comprising:

a micropump fluidly coupled to a microtube and operable to pump a fluid through the microtube;

a sensing structure made of a piezoelectric material and disposed in the microtube, wherein the microtube includes a sensing cavity having a cross-sectional area substantially larger than a cross-sectional area of a remainder of the microtube and the sensing structure is a thin beam affixed to an inner surface of the sensing cavity and extending into the sensing cavity; and a processing circuit electrically coupled to the sensing structure and operable to determine the force or flow rate of the fluid flowing through the microtube.

2. The end-effector of claim 1 wherein the sensing structure is made of a polyvinylidene fluoride material.

3. The end-effector of claim 1 wherein the sensing structure is a composite beam comprised of polyvinylidene fluoride material and polyester material or other plastic materials with the property of high elasticity.

4. The end-effector of claim 1 wherein the sensing structure is affixed only on one side to the sensing cavity such that a voltage, $V_s(s)$, output by the sensing structure correlates to a force, $f_c(s)$, exerted on the sensing structure as follows:

$$\frac{V_s(s)}{f_c(s)} = C_s \sum_{i=1}^{\infty} \left\{ \frac{[\Phi'_i(L) - \Phi'_i(0)]\Phi_i\left(\frac{L}{2}\right)}{\rho A(s^2 + \omega_i^2)} \right\}$$

where $\phi_i(r)$ are the eigenfunction satisfying the ordinary differential equation, a prime of $\phi_i(r)$ indicates a derivative with respect to position, L is the length of the beam, $\rho$ is a linear density of the beam, A is the cross sectional area of the beam and $\omega_i$ are natural frequencies of the beam.

5. The end-effector of claim 1 wherein the processing circuit is further operable to determine a flow rate of the fluid in the microtube.

6. The end-effector of claim 1 wherein the processing circuit is further operable to determine a flow rate of the fluid at an end of the microtube distal from the micropump.

7. The end-effector of claim 1 wherein the microtube having an inner diameter of approximately 254 μm.

8. A method for performing a micro/nano manipulation using a pneumatic end effector, comprising:
generating a micro force using a micropump disposed on an end-effector;
measuring the micro force using a sensing structure made of a piezoelectric material disposed in a flow path of the micropump;
controlling the micro force generated by the micropump based in part on the measured micro force; and
moving a micro/nano object with the end-effect by generating a suction force with the micropump.

9. The method of claim 8 wherein measuring the microforce further comprises correlating a voltage associated with the piezoelectric material to a force acting upon the sensing structure.

10. The method of claim 9 further comprises releasing the micro/nano object from the end-effector by generating a blow force with the micropump.

11. The method of claim 8 further comprises fluidly coupling a microtube to the micropump and disposing the sensing structure within the microtube.

12. The method of claim 8 further comprises constructing the sensing structure using a polyvinylidene fluoride material.

13. A micro/nano manipulation system, comprising:
a pneumatic end effector coupled to a movable member, the end-effector including
a micropump fluidly coupled to a microtube and operable to generate a fluid force at an open end of the microtube;
a sensing structure disposed in the microtube and operable to measure a fluid force acting thereupon, wherein the microtube includes a sensing cavity having a cross-sectional area substantially larger than a cross-sectional area of a remainder of the microtube and the sensing structure is a thin beam affixed to an inner surface of the sensing cavity and extending into the sensing cavity; and
a sensing circuit electrically coupled to the sensing structure and operable to output the measured fluid force; and
a controller in data communication with the sensing circuit and the micropump, the controller operable to control the fluid force generated by the micropump based on the measured fluid force.

14. The micro/nano manipulation system of claim 13 wherein the sensing structure is made of a polyvinylidene fluoride material.

15. The micro/nano manipulation system of claim 13 wherein the sensing structure is affixed only on one side to the sensing cavity such that a voltage, $V_s(s)$, output by the sensing structure correlates to a force, $f_c(s)$, exerted on the sensing structure as follows $$\frac{V_s(s)}{f_c(s)} = C_s \sum_{i=1}^{\infty} \left\{ \frac{[\Phi'_i(L) - \Phi'_i(0)]\Phi_i\left(\frac{L}{2}\right)}{\rho A(s^2 + \omega_i^2)} \right\}$$

Where $\phi_i(r)$ are the eigenfunction satisfying the ordinary differential equation, a prime of $\phi_i(r)$ indicates a derivative with respect to position, L is the length of the beam, $\rho$ is a linear density of the beam, A is the cross sectional area of the beam and $\omega_i$ are natural frequencies of the beam.

16. The micro/nano manipulation system of claim 13 is a closed loop control enabled system.

* * * * *

UNITED STATES PATENT AND TRADEMARK OFFICE
CERTIFICATE OF CORRECTION

PATENT NO.          : 8,079,278 B2                                            Page 1 of 1
APPLICATION NO.     : 11/989036
DATED               : December 20, 2011
INVENTOR(S)         : Ning Xi, Uchechukwu Wejinya and Yantao Shen It is certified that error appears in the above-identified patent and that said Letters Patent is hereby corrected as shown below:

In the Specifications

Column 1, Line 14, before "FIELD" insert -- GOVERNMENT SUPPORT CLAUSE

This invention was made with government support under 9796287 awarded by the National Science Foundation. The government has certain rights in the invention. --

Signed and Sealed this
Twenty-fifth Day of February, 2014

Michelle K. Lee
*Deputy Director of the United States Patent and Trademark Office*